United States Patent
Fathimulla et al.

(10) Patent No.: US 7,276,723 B2
(45) Date of Patent: Oct. 2, 2007

(54) ULTRA-LINEAR MULTI-CHANNEL FIELD EFFECT TRANSISTOR

(75) Inventors: Ayub Mohammed Fathimulla, Forest-Hill, MD (US); Harry Stephen Hier, Sykesville, MD (US); Olaleye Adetord Aina, Columbia, MD (US)

(73) Assignee: Epitaxial Technologies, Baltimore, MD (US)

( * ) Notice: Subject to any disclaimer, the term of this patent is extended or adjusted under 35 U.S.C. 154(b) by 0 days.

(21) Appl. No.: 11/205,484

(22) Filed: Aug. 18, 2005

(65) Prior Publication Data

US 2005/0285098 A1    Dec. 29, 2005

Related U.S. Application Data

(63) Continuation of application No. 10/176,787, filed on Jun. 24, 2002, now Pat. No. 6,992,319, which is a continuation-in-part of application No. 09/618,884, filed on Jul. 18, 2000, now abandoned.

(51) Int. Cl.
    *H01L 29/15* (2006.01)
(52) U.S. Cl. .................. 257/20; 257/287; 257/E29.072
(58) Field of Classification Search .................. 257/12, 257/14, 15, 20, 27, 183, 220, 241, 287, E29.071, 257/E29.072, E29.076, E29.246, E29.248
See application file for complete search history.

(56) References Cited

U.S. PATENT DOCUMENTS

| | | | | |
|---|---|---|---|---|
| 5,227,644 A | * | 7/1993 | Ueno | 257/20 |
| 5,254,863 A | * | 10/1993 | Battersby | 257/191 |
| 5,266,506 A | * | 11/1993 | Green, Jr. | 438/172 |
| 5,767,539 A | * | 6/1998 | Onda | 257/194 |
| 5,770,868 A | * | 6/1998 | Gill et al. | 257/190 |
| 6,064,082 A | * | 5/2000 | Kawai et al. | 257/192 |
| 6,121,641 A | * | 9/2000 | Ohno | 257/192 |
| 6,232,624 B1 | * | 5/2001 | Matloubian et al. | 257/194 |
| 6,414,340 B1 | * | 7/2002 | Brar | 257/192 |

* cited by examiner

*Primary Examiner*—Carl Whitehead, Jr.
*Assistant Examiner*—Jennifer M. Dolan
(74) *Attorney, Agent, or Firm*—H.C. Lin Patent Agent

(57) ABSTRACT

Alternate layers of wide band gap and narrow band gaps of different kinds of semiconductors are used to form multiple channels of a FET. The channels are doped or formed as 2-DEG/2-DHG in narrow band semiconductor by charge supply layer in the wide band gap semiconductor. The different kinds of semiconductors form heterojunctions to confine the electrons/holes in separate thin spikes layers. A number of spikes (3-10 nm thick) of different doped or 2-DEG/2-DHG concentrations in various channels can result in overall electron concentration gradient such as a $1/x^3$ electron/hole concentrations profile. Such an electron/hole concentration gradient can result in a linear variation of drain current with voltage to obtain a wide dynamic range.

23 Claims, 10 Drawing Sheets

| Layer | # |
|---|---|
| Cap | 46 |
| | 45 |
| Schottky Barrier Layer | 44 |
| ........................... | 43 |
| Wide Band gap Layer | |
| | 42 |
| Channel Layer 1 | |
| | 41 |
| Wide Band gap Layer | 40 |
| ........................... | 39 |
| Wide Band gap Layer | |
| | 38 |
| Channel Layer 2 | |
| | 37 |
| Wide Band gap Layer | 36 |
| ........................... | 35 |
| Wide Band gap Layer | 34 |
| | |
| Channel Layer 3 | 33 |
| Wide Band gap Layer | 32 |
| ........................... | |
| Buffer Layer | 31 |
| | |
| SI-InP (GaAs) | 30 |

Fig. 4

| Schottky Barrier/Cap |
|---|
| InP- Barrier Layer |
| N+-TlInP-Channel Layer 1 |
| InP- Barrier Layer |
| N+-TlInP-Channel Layer 2 |
| InP- Barrier Layer |
| N+-TlInP-Channel Layer 3 |
| InP-Barrier Layer |
| N+-TlInP-Channel Layer 4 |
| InP-Buffer Layer |
| SI-InP (GaAs) |

Fig. 9

ULTRA-LINEAR MULTI-CHANNEL FIELD EFFECT TRANSISTOR

This application is a continuation of application Ser. No. 10/176,787, filed Jun. 24, 2002, now U.S. Pat. No. 6,992,319, which is a continuation-in-part of application Ser. No. 09/618,884, filed Jul. 18, 2000, now abandoned.

BACKGROUND OF THE INVENTION (1) Field of the Invention

This invention relates to field effect transistors, in particular to a multiple channel, ultra-linear field effect transistors.

(2) Description of the Related Art

A field effect transistor (FET) normally is a square-law device. In the current saturation of the drain current ($I_D$) vs gate-to-source voltage ($V_{GS}$) of the characteristic of a FET, the basic relationship is given as:

$$I_D = K(V_{GS} - Vt)^2 \quad (1)$$

where K is a transconductance parameter, and Vt is the threshold voltage. When an input voltage is applied as a change in $V_{GS}$, the output current, which appears as the change in ID, does not vary linearly with $V_{GS}$. This square-law relationship causes non-linearity (harmonic distortion) and limits the dynamic range of amplifiers.

In equation (1), the threshold voltage Vt is assumed to be constant, based on a uniform impurity concentration N(x) of the semiconductor substrate. This threshold voltage is the voltage required to creating a maximum depletion layer in the substrate after strong inversion.

When the substrate concentration is not uniform, equation (1) must be modified, it was revealed by R. A. Pucel in a paper "Profile design for distortion reduction in microwave field-effect transistors" *Electronic Letters*, vol. 14, P. 204, 1978, that the $I_D$ can be characterized in terms of the non-linear distortion components as:

$$ID = Ido + Gm^{(0)}V_{GS} + \tfrac{1}{2}gm^{(1)}V_{GS}^2 + \tfrac{1}{6}gm^{(2)}V_{GS}^3 + \quad (2)$$

where $gm^{(n)}V_{GS}^n$ is the nth order distortion and gm(n) is the transconductance and its derivatives with respect to the gate voltage. Linear device operation occurs at signal levels ($V_{GS} \sim 0$) or when the higher order terns have been eliminated Signal distortion in amplifiers is due to the higher order terms, which become important at high signal levels.

To improve the linearity of a FET, the transconductance must be constant with varying gate voltage $V_{GS}$. The transconductance is strongly dependent on the electron distribution in the channel of the FET. Thus the design of a linear transistor demands paying attention to carrier distribution.

A measure of the linearity of a FET is the third order intermodulation ratio (IMR), which is the ratio of the power generated in a spurious third order intermodultion signal relative to the power in the dc desired signal. IMR has been shown to be proportional to the ratio of the third order component relative the first order (fundamental) component in Equation (2). Further more, Pucel has shown that this ratio can be expressed as:

$$IMR \propto |gm^{(2)}/gm^{(0)}| = (\kappa\epsilon_o/q)^2 |d/dx(1/x^3 N(x))|/N(x) \quad (3)$$

where N(x) is the charge distribution in the channel, κ is the relative dielectric constant, εo is the permittivity of free space, q is electronic charge and equation (3) is evaluated at the depletion edge boundary. The requirement for a highly linear device is for IMR to be small (close to 0). Therefore, from equation (3), either $x^3 N(x)$ is constant or $x^3$ tends to infinity. The former occurs when N(x) varies as $1/x^3$. In the U.S. patent application Ser. No. 09/618,884, we proposed to implement such a doping profile using multi-channel to achieve linearity in Hetrojunction Field Effect Transistors (HFETs). However, the invention was limited to specific doping profile in selected semiconductor materials such as InP and GaAs. Further, the lower mobilities of the HFET limit its applications to lower frequencies.

In a standard single channel High Electron Mobility Transistors (HEMTs), higher mobilities and sheet concentrations can be achieved as compared to HFETs. Therefore HEMT devices offer higher breakdown voltages and cut-off frequencies, low noise and higher power. There are numerous prior arts on single conducting channel HEMTs and its application to low noise and power applications. In U.S. Pat. No. 6,121,641 Ohno addressed the shielding of traps and suppression of short channel effect by insertion of p-type layer in a single conducting channel HEMT, and U.S. Pat. No. 5,767,539, Onda disclosed a field effect transistor having various designs for donor supply layer but with only one channel. Further, in the U.S. Patents to Mishima (U.S. Pat. No. 5,633,516), to Nakayama (U.S. Pat. No. 5,856,685), to Hida (U.S. Pat. No. 6,049,097), and to Matloubian (U.S. Pat. No. 5,663,583) variations to the single channel HEMT such as; two charge supply layer on either side of the channel layer, different material for spacer, various compositions of buffer and or channel have been proposed. However, there is no provision that the device can improve the linearity of the drain characteristic. U.S. Pat. No. 5,739,559 (the '559) to Isheda et al discloses a HEMT device having improved linearity. The patent '559 relates to a HEMT having asymmetrical carrier supply layers sandwiching a channel layer. More specifically, the heterojunction barrier height between the lower carrier supply layer and the channel layer is greater than the heterojunction barrier height between the upper carrier supply layer and the channel layer. Further, the patent '599 discusses only a single channel HEMT and silent regarding a HFETs in general, or having multiple channels in HFET and HEMT, or any specific carrier concentration and type of doping, or different materials for the multiple channels.

U.S. Pat. No. 6,015,981 to Gluck ("the patent '981") relates to a HFET having high modulation efficiency. FIG. 1, shows the cross-sectional view of the patent '981. As this figure illustrates, the HFET includes supply layer 3 having a doping layer 8, a layer packet 4 having multiple channels 41 and, and a supply layer 5 having a doping layer 9. The packet 4 has at least two repetitions of undoped channel 41 and undoped layer 42. The doping layers 8 and 9 serves to provide carrier concentration in the channels and doping layer 9 is characterized as having only a small number or no charge carriers. More specifically the patent '981 discloses a single doping layer 8 below the packet 4.Further the uniform doping is proposed which increases the gate to channel distance degrading the FET performance. As regards the electron concentration profile for the multiple channels HFET, the patent '981 has limited disclosure and teaches only concentration increases with distance from the gate. Further the patent is silent regarding different materials among the various multiple channels and teaches only Si/SiGe materials with GaAs/AlGaAs as an alternate material system.

Thallium (Tl) compounds of varying composition can be lattice matched to GaAs, InP and InAs. High electron mobilities have been predicted for TlP, TlAS, and TlSb (Schilfgaard et al, Applied Physics Letter, Vol. 65, pp 2714, 1994). Therefore FET with thallium compounds channels has the advantage of achieving highest gm, and cut-off frequencies exceeding the current state-of-the-art. Recently Tl compounds (U.S. Pat. No. 5,841,156 and references therein) have been proposed as detector, FET and HBT material. However, multi-channel HEMT or HFET for linearity has not been proposed.

SUMMARY OF THE INVENTION

An object of this invention is to obtain a linear dc $I_D$ variation as a function of $V_{GS}$ and a constant transconductance variation in the characteristics of a FET over a wide range of $V_{GS}$. Another object of this invention is to obtain a sharp impurity gradient in the channel of a FET. Still another object of this invention is to apply the multi-channel concept to other semiconductor material systems such as TlInP, TlGaInP, InAs, InAsSb etc selected from the Table 1. A further object of this invention is to optimize the impurity gradient in the channels of a HFET to obtain constant cut-off frequency variation over a wide range of $V_{GS}$.

These objects are achieved by using multiple channels for a FET. Alternate layers of doped and undoped different kinds of semiconductors form heterojunctions in the multiple channels. The heterojuncitons confine the electrons in separate thin spikes. A number of spikes of different electron concentrations can result in a sharp overall electron concentration gradient such as $1/x^3$ electron concentration profile. Such an electron concentration gradient can result in a linear variation of drain current with gate voltage to obtain a wide dynamic range.

In the second embodiment of the invention is to use multi-channel HEMT structure to increase the dynamic range of a FET. Specifically, one of the objects of this invention is to optimize the impurity gradient in the channels of a FET to obtain constant cut-off frequency variation over a wide range of $V_{GS}$.

These objects are achieved by heterojunction FET having multiple two dimensional electron (or hole) gas channels formed by using alternate layers of narrow band gap and wide band gap different kinds of semiconductors (form heterojunctions) deposited on a substrate with a buffer layer. In the invention multiple two dimensional electron (or hole) channels are formed in narrow band gap semiconductor by inserting a thin planar or spikes doping in the multiple wide band gap semiconductor (charge supply) layers. The multiple number of spikes of different acceptor/donor concentrations in the wide band gap semiconductor can result in any arbitrary overall hole/electron concentration gradient or specifically $1/x^3$ electron concentration profile. Such an electron concentration gradient ($1/x^3$) can result in a linear variation of drain current with gate voltage to obtain a wide dynamic range. In the third embodiment of the invention is to implement a multi-channel Insulated Gate HFET and HEMT to further increase the breakdown voltage and dynamic range of a FET.

BRIEF DESCRIPTION OF THE SEVERAL VIEWS OF THE DRAWINGS

FIG. 4 shows the generic structure of the multi-channel HEMT according to the second embodiment.

FIG. 9 shows the substrate structure of a HFET with multiple channels with TlInP/InP heterojuctions.

Table 1 shows the material structures of the multi-channel FET (HFET/HEMT) of the present invention for the first and second embodiment.

DETAILED DESCRIPTION OF THE INVENTION

Figure 1:
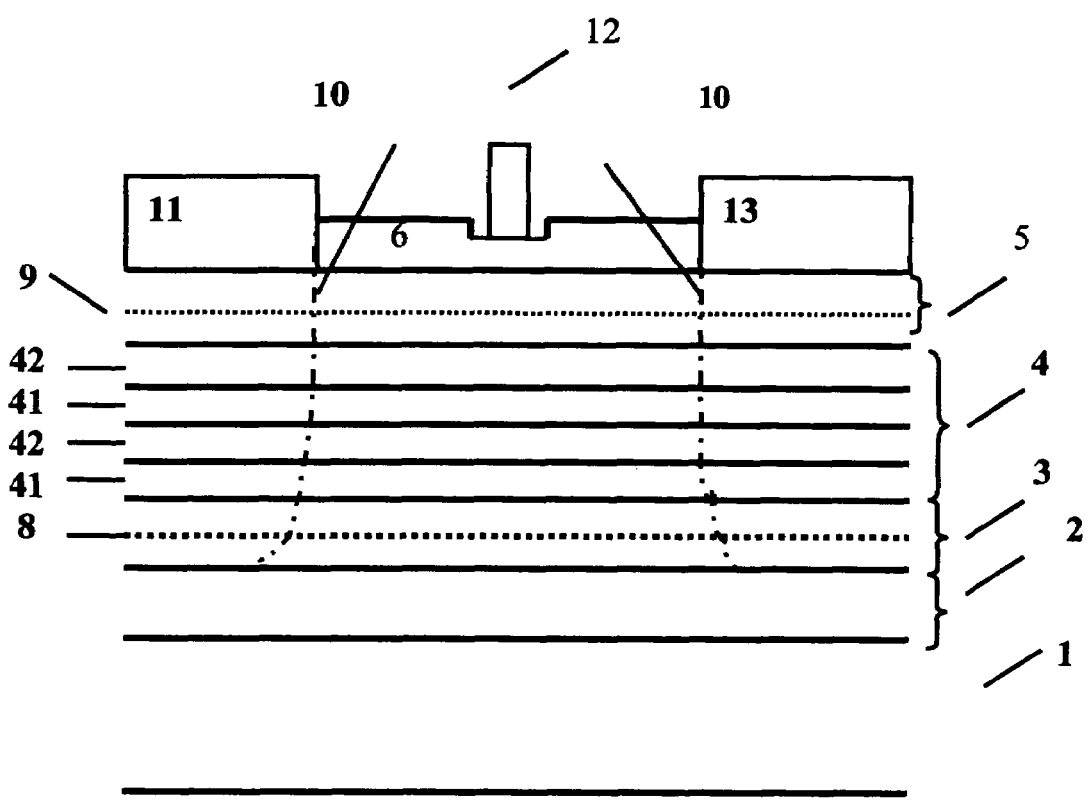
FIG. 1 shows the cross section of the device from U.S. Pat. No. 6,015,981 to Gluck
Figure 2:
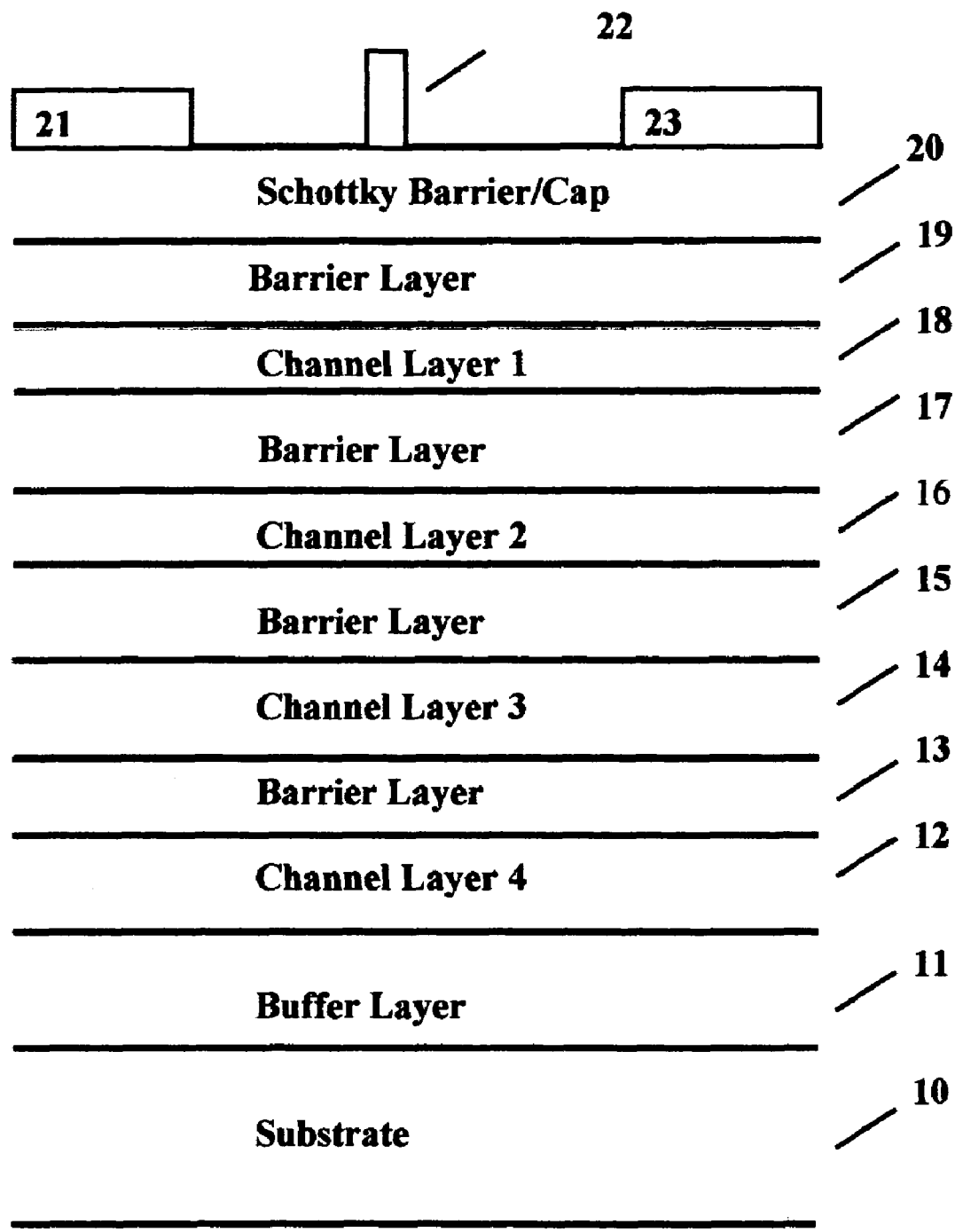
FIG. 2 shows the substrate structure of a HFET with multiple channels with heterojuction.

FIG. 2 shows the basic structure of multiple channel heterojunction field effect transistor of the present invention. The structure has a substrate 10 and an undoped buffer layer 12 deposited on the substrate. The multiple channel HFET is formed with alternate undoped barrier layers 12, 14, 16, 18 of a first kind of semiconductor and doped channel layers 13, 15, 17 of a second kind of semiconductor. The two kinds of different semiconductor material form heterojunctions in the multiple channels. Another layer 20 is used to cap the multiple channels. An optional oxidation barrier is inserted (e.g. to protect layers such as AlSb, AlAsSb) between the layer 19 and cap 20. A thin layer of undoped GaAs cap can be used to improve the uniformity of the threshold voltage of the HFET. Alternately doped GaInAs (or InAs) can be used as the cap, but requires recess etching before forming metal gate. Over the layer 20, the source 21, gate 22 and drain 23 are formed laterally. Ohmic contacts are sintered to form the source and drain, which make contacts to the multiple channels. Various combinations of the barriers, channels, buffers and substrates can be selected from the Table 1. The number of channels are more than two and the conductivity of the channels can be either n or p-type. Uniform or delta or spike or planar doping can be used for the channel. The FET structure can be designed to give optimum noise figure parameters (peak gm at 10% $I_{dsat}$) uniform gain, $F_r$, and $F_{max}$ with gate voltage. By proper selection of charge density, peak in gm close to pinch-off and or zero gate voltage can be realized in multi-channel FET. In the narrow band gap layer quantum dots, (e.g. InAs in GaAs, TlP or TlAs in GaInAs or GaAs) and sub-channel (e.g. InAs in GaInAs) can be inserted to increase the carrier density and mobility. The substrate can be InP, GaAs, GaN, Si, SiC or other substrates on which the FET heterostructure is transferred by bonding or liftoff or heteroepitaxial growth.

Figure 3:
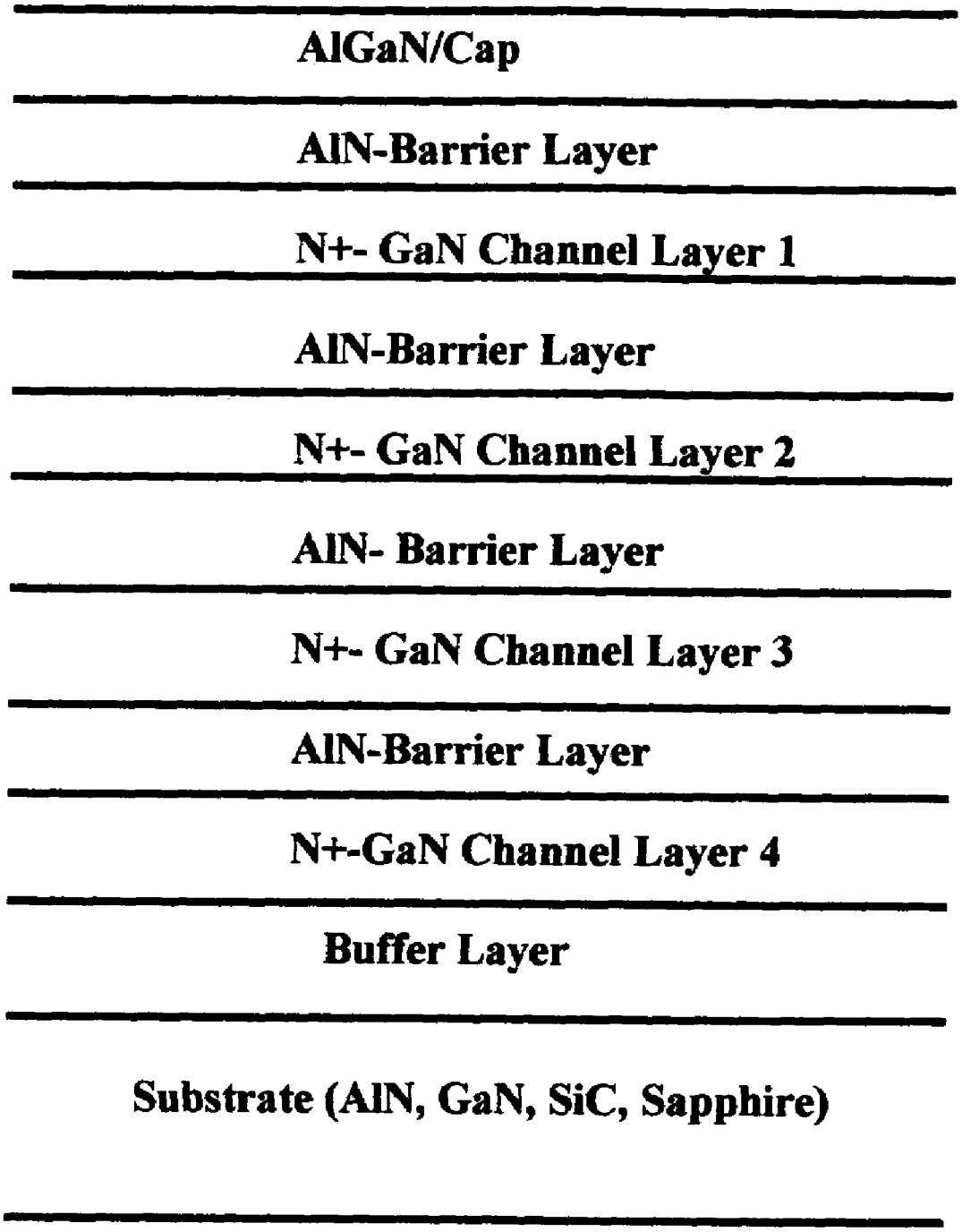
FIG. 3 shows the substrate structure of a multiple channels GaN/AlN HFET

An example of the multiple channels GaN/AlN HFET having n-type conducting is shown in FIG. 3. The doped GaN layers form quantum wells and the undoped AlN layers form barrier layers and confine the dopants (electrons) within their own doped layers without diffusing into a neighboring doped layers. Thus, spikes of high electron concentration can be formed to achieve any desirable impurity profile. Any combination of N based wide band gap, narrow band gap, buffer, and of the channel (as shown in Table 1) can be used to implement multiple channels HFET.

The use of thinner doped channels allows reducing the gate to channel distance to improve the charge control.

While FIG. 3 shows four doped layers, the number of doped layers and their distribution (variation) with depth are not limited to these numbers of layers. While the preferred embodiments of the invention have been described, it will be apparent to those skilled in the art that various modifications may be made in the embodiments without departing from the spirit of the present invention. Such modifications are all within the scope of this invention.

In the second embodiment of the invention is to use multi-channel HEMT structure to achieve ultra-linear device. A conventional and generic single channel HEMT structure uses a buffer layer, channel layer, spacer layer, charge supply layer, Schottky barrier, cap, source, drain, and gate formed on a substrate. In the single channel HEMTs higher mobilities and sheet concentrations can be achieved as compared to HFETs. HEMT devices offer higher breakdown voltages and cut-off frequencies, low noise and higher power. In the prior art variations to the single channel HEMT such as; two charge supply layer on either side of the channel layer, different material for spacer, various compositions of buffer and or channel have been proposed. Our device design consists of multiple channels (2-DEG or 2-DHG) and the location and number of the conducting channel distinguish from the prior art. In the multi-channel HEMTs higher mobilities and sheet concentrations can be achieved as compared to HFETs, the first embodiment of the invention. Therefore the proposed devices can be used where higher breakdown voltages and higher operating frequencies, low noise and higher power are required.

A generic structure of the said device is shown in the FIG. 4. In the figure the buffer layer 31 comprises of any semiconductor material to reduce dislocations of the channel and sub s or also arising from the lattice mismatched layers. For example InP, AlInAs, AlAsSb, AlGaAsSb and GaAs, AlGaAs, GaInP, AlInP for the InP and GaAs substrates respectively. The buffer layers can be metamorphic or graded for lattice mismatched semiconductor layers. The conducting channels 34, 38, 42 are formed by creating a two dimensional electron gas (2 DEG) or hole gas (2 DHG) in the narrow band gap semiconductor. The channel can be comprised of a binary, ternary, or quaternary pseudomorphic or lattice matched compound semiconductor layers. The channels can also contain embedded quantum dots, sub-wells. For example GaInAs, InAsP, InP, GaInAsP, GaAsSb and GaAs, GaInAs, GaAsSb lattice matched or pseudomorphic materials as the channel layers for InP and GaAs based FETs. The wide band gap layers 33, 35, 37, 39, 41, 43, and 45 can be AlInAs, AlSbAs, AlGaAsSb, InP and AlGaAs, AlAs, AlInP, GaInP material system or any combinations for InP and GaAs based FETs respectively. Typical thicknesses of wide band gap barrier and the channel are 2-10 nm.

The spike dopings 32, 35, 40, and 43 can be Si, Sn, Te and Be, C for n and p-type FETs. Spike provides the donor or acceptor supply layer for the FET. Using the spike doping or delta or planar doping reduces the distance between the gate and the channels that need to be optimize for sub-micron devices. Further, the breakdown voltage of the multi-channel HEMT will be higher due to quantum confinement In the FIG. 4, the spike doping and the position of the spike can be adjusted to give the required doping profile for the linearity. Layer 45 is used as a Schottky layer or Schottky enhancement layer.

Figure 5:
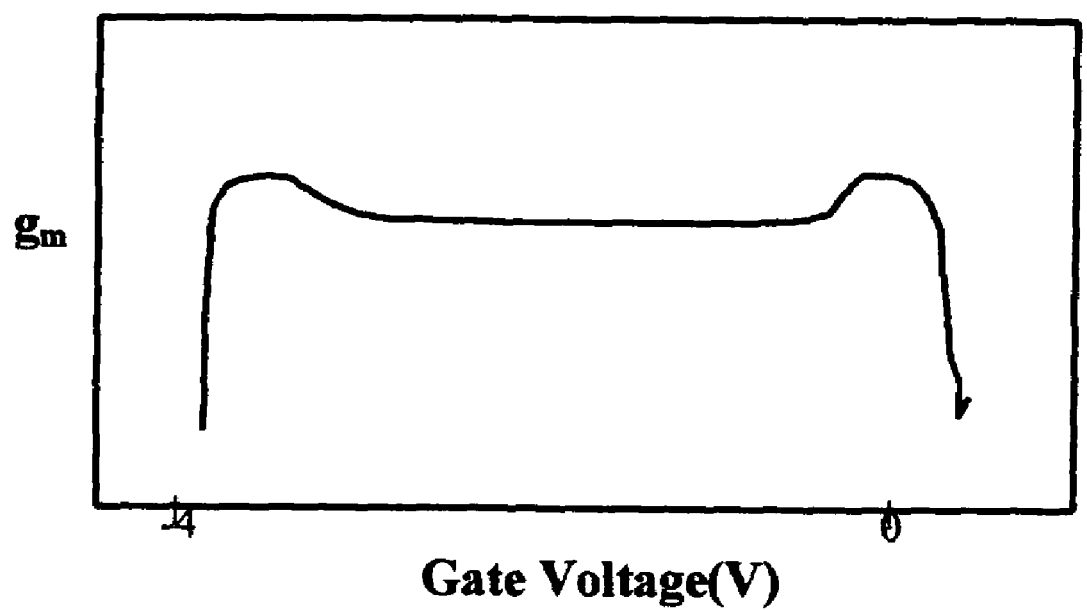
FIG. 5 shows the gm vs $V_{GS}$ characteristics of a multi-channel HEMT designed for low noise and high power applications

The multi-channel HEMT is capped with doped or undoped layer 46, or in combination of oxidation barrier. The cap can be N+GaAs, N+GaInAs and the oxidation barrier can be AlInAs for AlAsSb. For example the optional oxidation barrier can be used.to protect layers such as AlSb and AlAsSb. The doped GaInAs (or InAs) used as the cap requires recess etching before forming metal gate. A thin layer of undoped GaAs cap can be used to improve the uniformity of the threshold voltage of the HEMT. Over the layer 46, the source, gate and drain are formed laterally. Ohmic contacts are sintered to form the source and drain, which make contacts to the multiple channels. Specific layers that can be used to implement the linear device are shown in the Table 1. In the table multi-channel HEMTs can be implemented on InP, GaAs, and sapphire substrates using lattice matched structures or mismatched structures using metamorphic buffer to accommodate the lattice mismatch. The number of channels can be selected depending on the linearity requirement, or other applications. The conductivity of the channels can be either n or p-type. The HEMT structure can be designed to give optimum noise figure parameters (peak gm at 10% $I_{dsat}$), and uniform gain, $F_t$, and $F_{max}$ with gate voltage. For example by proper selection of charge density, peak in gm close to pinch-off and or zero gate voltage can be realized in multi-channel HEMT (FIG. 5). The subsume can be InP, GaAs, GaN, Si, SiC or other substrates on which the FET heterostructure is transferred by bonding or lift-off or heteroepitaxial growth. The combination of the wide/narrow band gaps are selected from Table 1: GaAs/(AlGaAs, GaInP, AlAs,AlInP), (GaInAs, GaAsSb, TlGaP, TlGaInP)/(AlGaAs, AlAs, GaInP, A;InP), (GaInAs, GaAsSb, GaInAsP, AlGaInAs, InP) /(AlInAs, AlInAsSb, AlGaPSb, InP, AlGaAsSb, AlAsSb), (TlGaInP, TlInP, TlGaInAs)/(AlInAs, AlAsSb, AlInAsSb, AlGaAsSb), InAsP/(AlInAs, AlGaAsSb, InP, AlInAsSb), (InAs, InAsSb, GaInAsSb, TlInAs)/(AlGaAsSb, AlSb, AlAsSb, AlGaSb, AlInAsSb), InSb/AlInSb, GaN/AlGaN, GaInN/AlGaN, etc. and any other combination of binary, ternary, quaternary III-V semiconductor. Ultra-linear HEMT can be extended to IV-IV semiconductor (Si, Ge, Sn, C), II-VI semiconductors (ZnSe, ZnS, CdTe, CdS, etc) or combinations of III-v and IV-/IV (e.g. GaP/Si) or IV-IV and II-VI (e.g. ZnS/Si). The wide band gap semiconductor layer under the metal gate provides the necessary Schottky barrier height.

Figure 6:
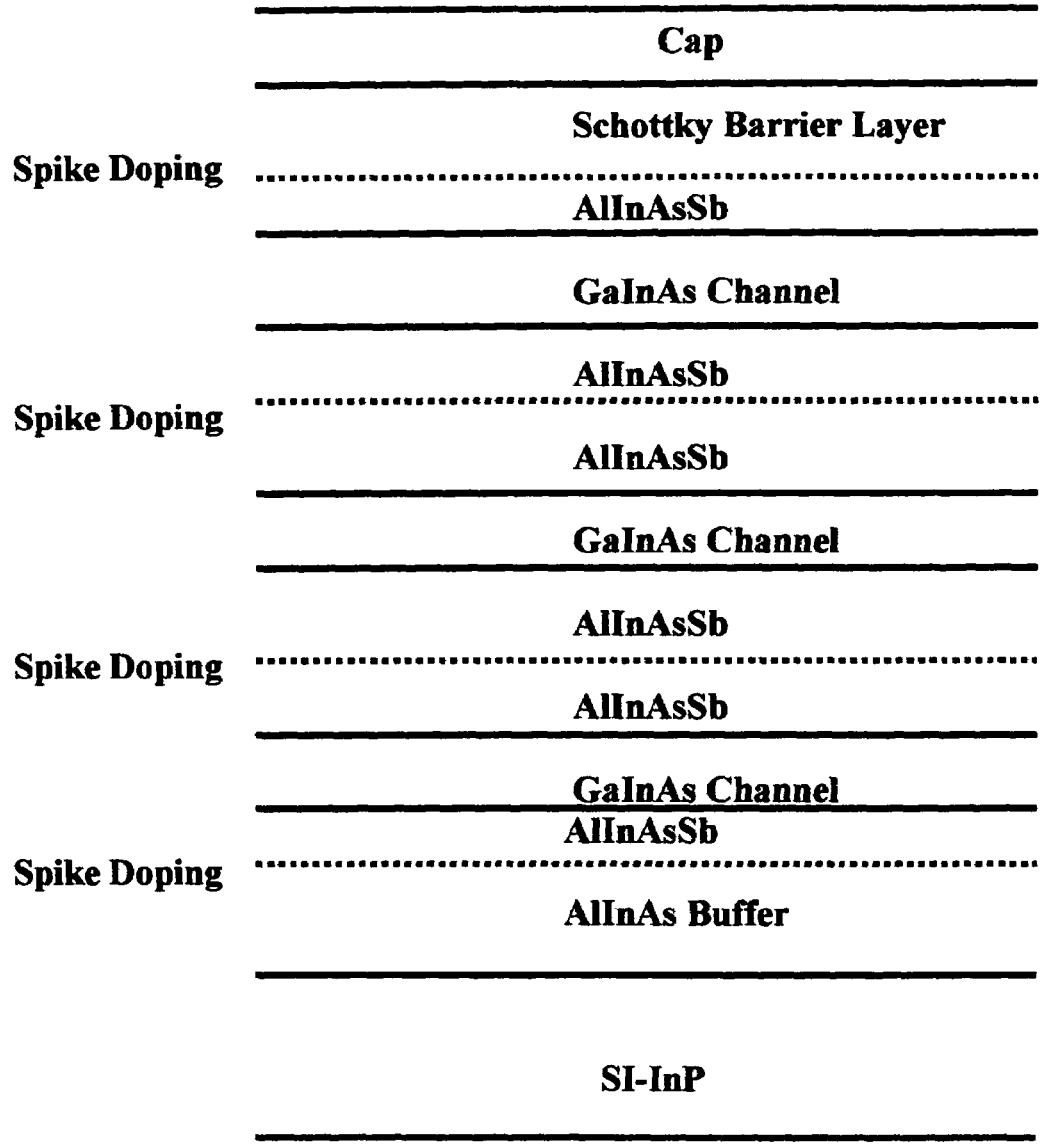
FIG. 6 shows the multiple AlInAsSb/GaInAs channel HEMT structure of the present invention.
Figure 7:
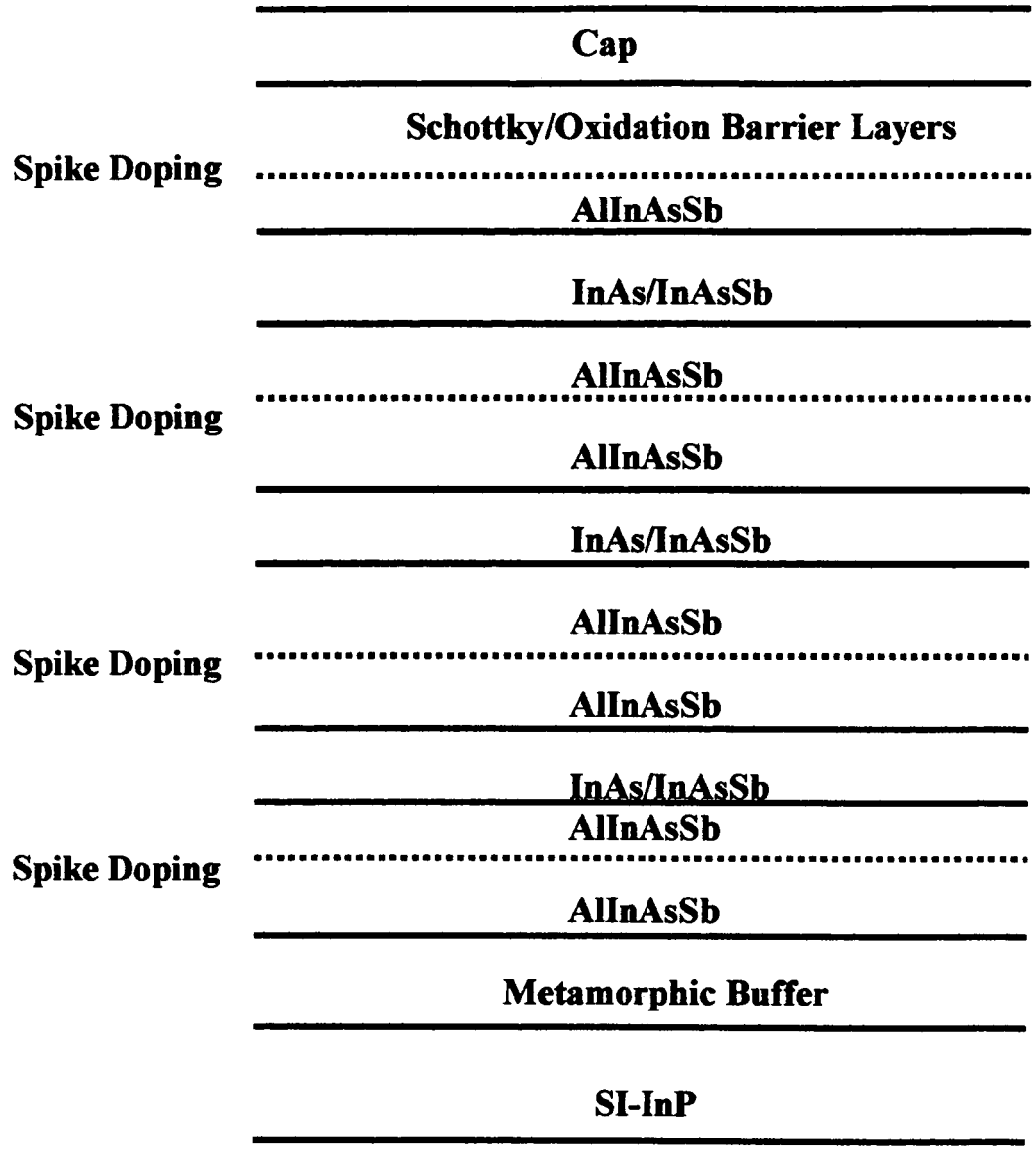
FIG. 7 shows the structure of the multi-channel HEMT using InAs/AlInAsSb based heterostructure.
Figure 8:
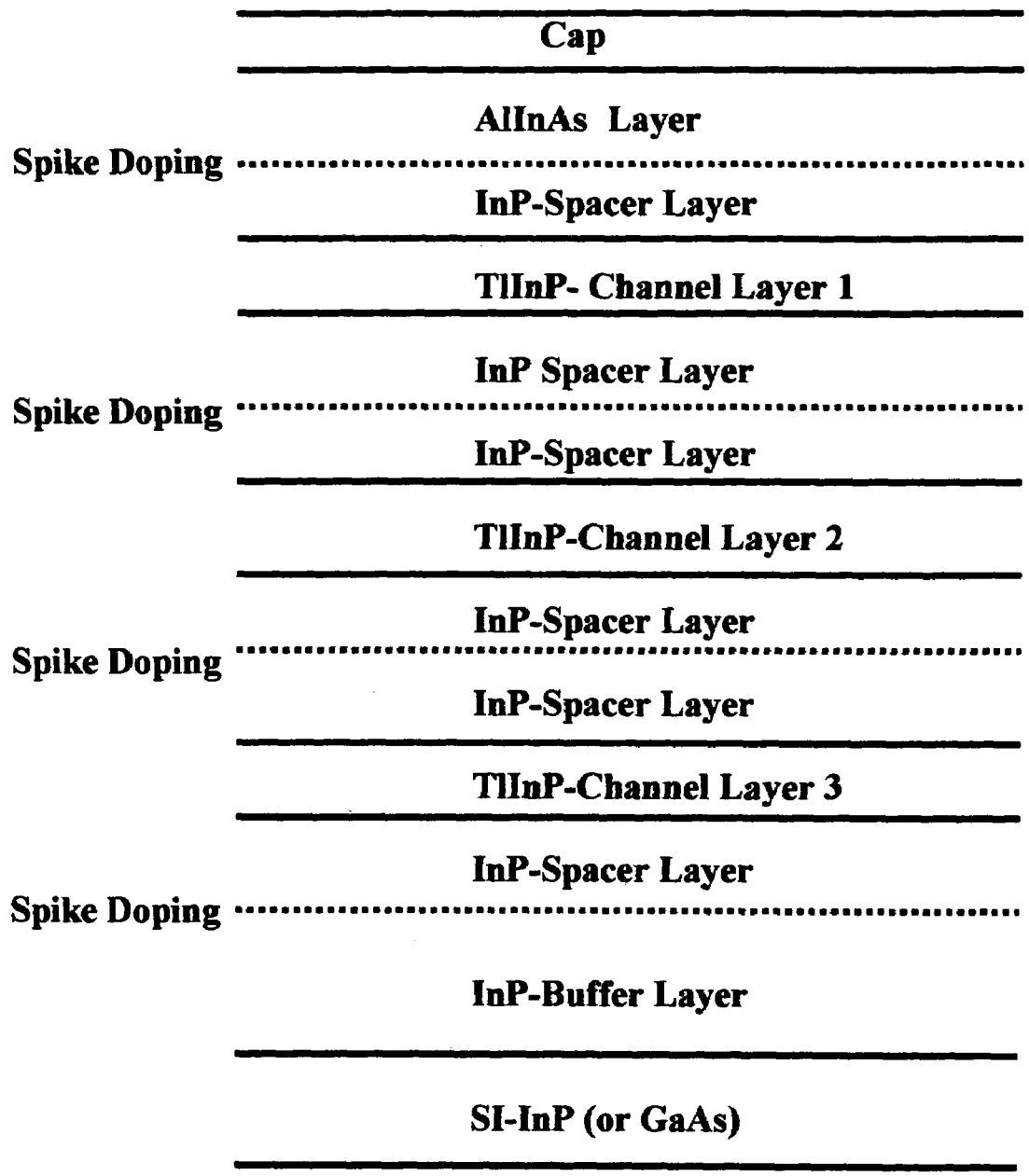
FIG. 8 shows the structure of the multi-channel HEMT using TlInPInP based heterostructure

An example of multiple channel AlInAsSb/GaInAs HEMT structure is shown in FIG. 6, in which layers 31, 33, 35, 37, 39, 41, 43, and 45 is AlInAsSb and layers 33, 38, and 42 is GaInAs over a InP substrate 30. Spike doping of Si 32, 36, 40 and 44 is used as the donor layer in the wide band gap semiconductor. A second example of the multiple channels HEMT uses AlInAsSb/InAs pair formed on metamorphic buffer. The metamorphic buffer is used to accommodate the lattice mismatch between InP and InAs. The structure can be also formed on GaAs substrate using the metamorphic buffer. The structure can be capped with an undoped layer of GaAs to produce a high quality Schottky contact Thallium (Tl) compounds of varying compositions can be lattice matched to InP, GaAs, and InAs substrates. For example TlGaInP, TlInP and TlGaInAs can be used lattice matched to InP and TlGaP, TlGaInP to GaAs and TlInAs to InAs substrate. In this invention we also propose Tl compounds for realizing multi-channel HEMT and HFET for linearity. FIGS. 7 and 8 shows the typical layered structures of the HFET and HEMT. The material structure is not limited to these layers, but any combination of the material TlAs, TlP, TlSb with GaInAs, GaAs, InP, InAs and GaSb on InP and GaAs substrate can be used for the doped or 2 DEG or 2-DHG channel. Various combinations of the barriers, spacers, channels and buffers can be selected from the Table 1.

Figure 10:
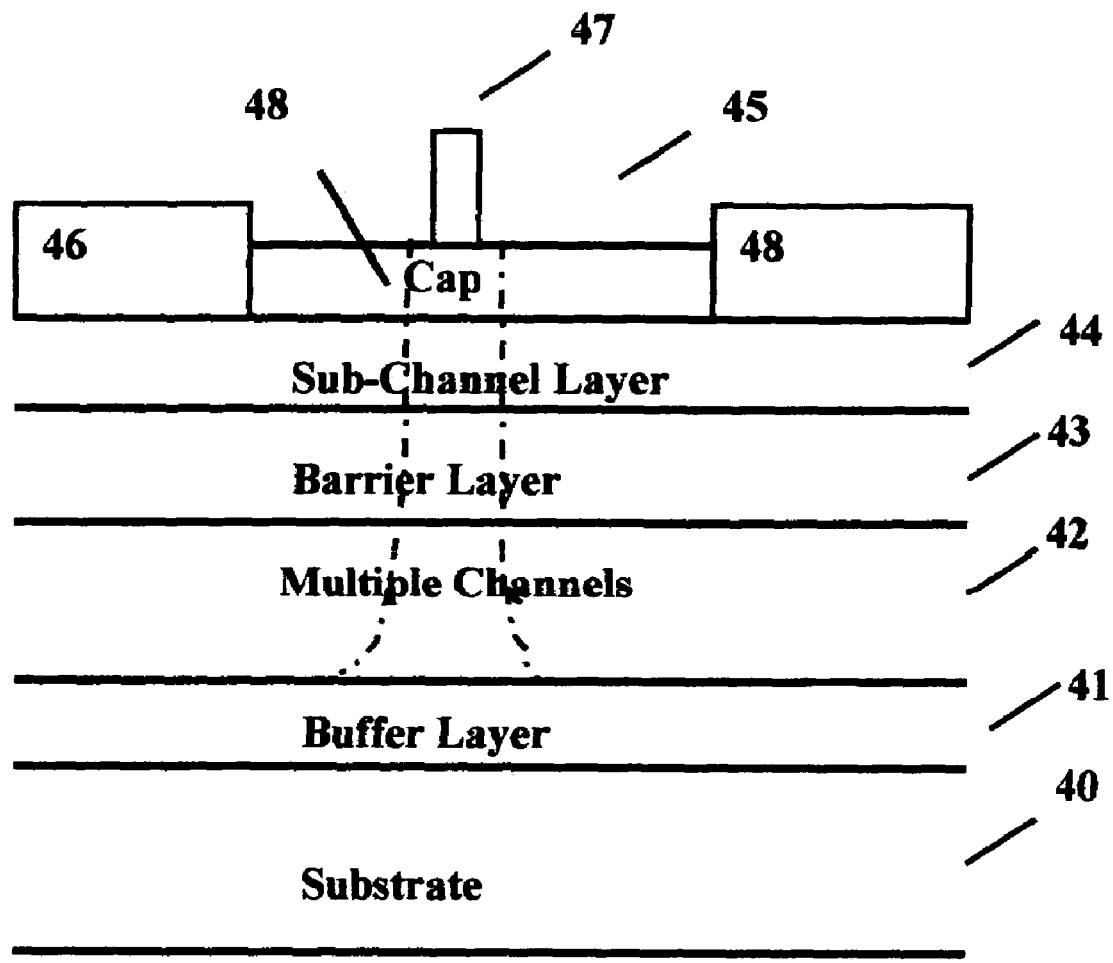
FIG. 10 shows the multiple channel Insulated Gate FET (IGFET) structure of the third embodiment of the invention.

In the third embodiment of the invention is to use multi-channel HEMT and HFET structures to create an insulated gate FET (IGFET) (shown in FIG. 10) to achieve ultra-linearity in the device. An insulated gate FET structure uses a buffer layer 41, multiple channels of HFET or HEMT 42, barrier layer 43, sub channel layer 44, cap 45, source 46, drain 48, and gate 47 formed on a substrate. The layer 45 can be thermally grown or deposited insulator such as $SiO_2$, $Si_3N_4$, $Al_2O_3$, AlN oxides of GaAs, AlAs ($Al_2O_3$), AlGaAs ($Al_2O_3$) and InP (ex: $InPO_4$). The sub channel layer 44 (e.g. Si, Ge, InP, GaInAs, InAs etc.) provides lower surface state density between semiconductor and dielectric and also gives an additional channel. The IGFET offers higher breakdown voltages compared to HFET or HEMT, therefore these devices can be used for high power applications.

A variation of IGFET is to use all undoped wide band gap/narrow band gap layers and implants 49 (n or p) self aligned with gate to accumulate electron or holes in the channels. For example Si/SiGe, InP/GaInAs, GaAs/AlGaAs, GaN/AlN etc pairs can be used. Further, by selective implantation of n and p, a complimentary FET can be implemented. A further variation of the IGFET is to use the Type II band line up pair such a GaSb/InAs, GaAsSb/GaInAs to form complimentary FETs by accumulating holes in GaSb (GaAsSb) and electrons in InAs (GaInAs). In these material system, a single implant (Si) can be used for n and p doping (for Sb>0.6). The combination of wide band gap/narrow band gap, barrier, and of the cap can be extended to other semiconductor.

While FIGS. 6, 7 and 8 shows three 2-DEG layers and four charge supply layers, the number of 2-DEG and spike doped layer and their distribution (variation) with depth are not limited to these numbers of layers. While the preferred embodiments of the invention have been described, it will be apparent to those skilled in the art that various modifications may be made in the embodiments without departing from the spirit of the present invention. Such modifications are all within the scope of this invention.

drain voltage characteristics when a gate voltage exceeding the threshold voltage is applied at the gate, said multiple channels having alternate layers of undoped layers of first kind of semiconductor and doped layers of second kind of semiconductor, and said doped layers having doping concentrations which varies in steps with depth from said gate, wherein the channels are selected from the group consisting of uniformly doped, delta doped, spike doped, doped sub-well, and (InAs sub-well, TlP (TlAs) sub-well, InN sub-well and InAs, TlP, TlAs, InN) self assembled quantum dots for Ill-V compound semiconductors, wherein the channels are selected from the group consisting of uniformly doped, delta doped, spike doped, Ge sub-well, Sn sub-well and self assembled quantum dots selected from the group consisting of Ge and Sn for IV-IV compound semiconductors, and formed on buffer layer grown on the substrate, and wherein said the doped channel/undoped barrier semiconductor pairs are selected from the group of II-VI/III-V, IV-IV/III-V, IV-IV/II-VI semiconductors consisting of Si/GaP, Si/ZnS, GaAs/ZnSe, and InSb/CdTe.

2. A metal semiconductor Schottky barrier hetero-junction field effect transistor (HFET) comprising:

a substrate, a source, a gate and a drain;

multiple channels in said substrate between said drain and said source to improve the linearity of drain current vs drain voltage characteristics when a gate voltage exceeding the threshold voltage is applied to the gate, wherein said multiple channels have alternate layers of doped layer of first kind of semiconductor and undoped layers of second kind of semiconductor, said multiple channels are created in second kind semiconductor by doping the first kind semiconductor, and said doped layers have doping concentrations which decreases in steps with depth from said gate;

TABLE 1

| Substrate | Buffer | Barrier Layers (Spacer) | Channel Layer Lattice Matched or Pseudomorphic | Schottty Barrier Layer |
|---|---|---|---|---|
| GaAs | Lattice Matched | AlGaAs/GaInP/ AlInP/AlGaPSb | GaAs,TlGaInP GaInAs, GaAsSb, GaAsN, GaInAsN | AlGaAs/GaInP/ AlInP |
| InP | Lattice Matched | AlInAs/AlGaAsSb/ AlAsSb/AlInAsSb/ InP/AlGaPSb | GaInAs, GaAsSb, GaInAsP, TlGaInP, TlInP, TiGaInAs, InP, AlGaInAs, InAsP, | AlInAs/AlGaAsSb/ AlInAsSb/ |
| GaAs | Metamorphic | AlInAs/AlGaAsSb/ AlAsSb/AlInAsSb/ InP/AlGaPSb | GaInAs, GaAsSb GaInAsP, TlGaInIP, TlInP,TllGaInAs, InP, AlGaInAs | AlInAs/AlGaAsSb/ AlInAsSb/ |
| GaAs/ InP | Metamorphic | AlGaSb/AlAsSb/ AlInAsSb/ AlGaAsSb | GaSb, $Ga_{.9}In_{.1}Sb$, InAs, InAsSb | AlSb/AlGaSb/ GaAs |
| GaN | Lattice Matched | AlGaN/AlN | GaN, GaAsN, InN, GaInN | AlGaN/AlN |
| Saphire/ SiC/Si | Metamorphic | AlGaN/AlN | GaN, GaAsN, InN, GaInN | AlGaN/AlN |

The invention claimed is:

1. A field effect transistor (FET) comprising:

a substrate, a source, a gate and a drain;

multiple channels in said substrate between said drain and said source to improve the linearity of drain current vs a Schottky layer over said multiple channels; and two undoped layers to cap the multiple channels and to support said source, said drain and said gate.

3. The HFET as described in claim 2, wherein said layers of first kind are selected from the group consisting of binary, ternary and quaternary compound semiconductor layers lattice mismatched to the substrate.

4. The HFET as described in claim 2, wherein said layers of first kind are selected from the group consisting of binary, ternary and quaternary compound semiconductor layers lattice-matched to the substrate.

5. The HFET as described in claim 2, wherein said second kind 2-DEG channels are selected from the group consisting of binary, ternary and quaternary compound semiconductor layers pseudomorphic to the substrate.

6. The HFET described in claim 2, wherein said second kind 2-DEG channels are selected from the group consisting of binary and quaternary compound semiconductor layers lattice mismatched to the substrate.

7. The HFET as described in claim 2, wherein said channels comprise of compounds of TlP, TlAs, TlSb, having: at least one of the said channel of TlInP, at least one of the said channel of TlGaInAs, and at least one of the said channel of TlGaInP.

8. The HFET as described in claim 2, wherein any combination of the first kind/second kind pairs lattice matched to the group consisting of GaAs and Ge substrate is selected from the group III-V compound semiconductor family consisting of: GaAs/(AlGaAs, GaInP, AlAs, AlInP), TlGaP/(AlGaAs, GaInP, AlAs, AlInP).

9. A HFET as described in claim 2, wherein any combination of the first kind/second kind pairs lattice mismatched to InP substrate are selected from the group III-V compound semiconductor family consisting of: (GaInAs, GaInAsP, AlGaInAs, GaAsSb, InAsP)/(AlInAs, AlInAsSb, AlGaPSb, AlGaAsSb, AlAsSb, AlGaInAsSb), (TlGaInIP, TlInP, TlGaInAs)/(AlInAs, AlAsSb, AlInAsSb, AlGaAsSb) and (GaInAs, AlGaInAs, GaInAsP/InP).

10. The HFET as described in claim 2, wherein the first kind/second kind mismatched to substrate selected from the group consisting of GaAs and Ge are selected from the group III-V compound semiconductor family consisting of: GaInAsN/(AlGaAs, GaInP, AlInP, AlAs), GaAs/AlGaPSb, (GaInAs, GaInAsP, AlGaInAs, GaAsSb, InAsP)/(AlGaAs, GaInP, AlInP, AlAs, AlInAs, AlInAsSb, AlGaPSb, AlGaAsSb, AlAsSb, AlGaInAsSb), (TlGaP, TlGaInP, TlInP, TlGaInAs)/(AlGaAs, GaInP, AlInP, AlAs, AlInAs, AlAsSb, AlInAsSb, AlGaAsSb) and (GaInAs, AlGaInAs, GaInAsP/InP).

11. The HFET as described in claim 2, wherein any combination of the first kind/second kind pairs are selected from the group III-V compound semiconductor family consisting of: (GaSb, GaAsSb, GaInSb)/(AlGaAsSb, AlSb, AlSbAs, AlInAsSb), (InAs, InAsSb)/AlGaAsSb, AlSb, AlAsSb, AlGaSb,AlInAsSb), GaInAsSb/AlGaAsSb, AlSb, AlAsSb, AlGaSb, AlInAsSb), TlInAs/(AlGaAsSb, AlSb, AlAsSb, AlGaSb, AlInAsSb), InSb/AlInSb.

12. The HFET as described in claim 2, wherein any combination of the first kind/second kind pairs deposited on the group consisting of Sapphire, GaN, SiC and AlN substrate is selected from the group III-V compound semiconductor family consisting of: GaN/AlGaN, GaInN/AlGaN, GaN/AlN and GaInN/AlN.

13. The HFET as described in claim 2, further comprising an undoped buffer layer between said substrate and said multiple channels, wherein the said buffer is selected from the group consisting of AlInP, AlGaAs, AlAs, GaInP on GaAs substrate.

14. The HFET as described in claim 2, further comprising an undoped buffer layer, wherein said buffer is selected from the group consisting of metamorphic and graded AlInAs, AlGaInAs, AlSbAs, AlGaAsSb, AlInAsSb, AlSb, AlGaSb on GaAs substrate.

15. The HFET as described in claim 2, wherein said the first kind semiconductor and the second type semiconductor are selected from the group II-VI semiconductors family consisting of ZnSe, ZnS, CdTe, and CdS.

16. The HFET as described in claim 2, wherein said the first kind semiconductor and the second type semiconductor are selected from the group of II-VI/III-V, IV-IV/III-V, IV-IV/II-VI semiconductors family consisting of Si/GaP, Si/ZnS, GaAs/ZnSe, and InSb/CdTe.

17. The HFET as described in claim 2, wherein alternate layers of first kind of semiconductor and a second kind of semiconductor forming heterojunction are selected from the group of IV-IV semiconductor family consisting of Si, Ge, Sn and C and said multiple channels are created in first kind semiconductor by doping the second kind semiconductor.

18. The HFET as described in claim 17, wherein said any combination of lattice first/second kind pairs are selected from the group of IV-IV semiconductor family consisting of SiGe/Si, GeC/Si, SiGeC/Si, GeC/Si, GeSn/Si, Si/SiGe, Si/SiC, SiGe/SiC, Si/SiGeC, SiGe/SiGeC.

19. The HFET as described in claim 17, wherein the channels are selected from the group consisting of Ge sub-well, Sn sub-well and self assembled quantum dots; and the charge supply layer is selected from the group consisting of delta doped, spike doped, and planar doped.

20. The HFET as described in claim 17, further comprising a cap over said FET multiple channels and support said source, said drain, and said gate.

21. The HFET as described in claim 17, wherein the cap provides Schottky barrier selected from the group consisting of Si and GaP.

said multiple channels of 2-DEG or 2-DHG are created in second kind semiconductor by selective implantation into both first and second kind semiconductor, and said multiple channels are created in second kind semiconductor by doping with N- or P-type conductivity and using undoped second kind semiconductor.

22. The HFET as described in claim 2, further comprising an undoped buffer layer between said substrate and said multiple channels, wherein said buffer is selected from the group consisting of lattice matched InP, AlGaInAs, AlInAs, AlSbAs, AlGaAsSb, AlInAsSb on InP substrate.

23. The HFET as described in claim 2, further comprising an undoped buffer layer between said substrate and said multiple channels, wherein said buffer is selected from the group consisting of metamorphic and graded AlInAs, AlGaInAs,AlSb, AlGaSb, AlSbAs, AlGaAsSb, AlInAsSb on InP substrate.

* * * * *